(12) United States Patent
Wei

(10) Patent No.: US 11,962,016 B2
(45) Date of Patent: Apr. 16, 2024

(54) FILM AND PREPARATION PROCESS

(71) Applicant: SHENZHEN YUANZI TECHNOLOGY CO., LTD., Shenzhen (CN)

(72) Inventor: Ding Wei, Shenzhen (CN)

(73) Assignee: SHENZHEN YUANZI TECHNOLOGY CO., LTD., Shenzhen (CN)

( * ) Notice: Subject to any disclaimer, the term of this patent is extended or adjusted under 35 U.S.C. 154(b) by 488 days.

(21) Appl. No.: 17/292,434

(22) PCT Filed: Nov. 9, 2018

(86) PCT No.: PCT/CN2018/114847
§ 371 (c)(1),
(2) Date: May 8, 2021

(87) PCT Pub. No.: WO2020/093375
PCT Pub. Date: May 14, 2020

(65) Prior Publication Data
US 2022/0021003 A1    Jan. 20, 2022

(51) Int. Cl.
*H01M 4/66* (2006.01)
*C23C 14/02* (2006.01)
(Continued)

(52) U.S. Cl.
CPC ........... *H01M 4/667* (2013.01); *C23C 14/024* (2013.01); *C23C 14/14* (2013.01); *C23C 28/021* (2013.01);
(Continued)

(58) Field of Classification Search
CPC ..... C23C 14/024; C23C 14/081; C23C 14/14; C23C 14/205; C23C 14/562;
(Continued)

(56) References Cited

U.S. PATENT DOCUMENTS

2006/0040170 A1    2/2006  Liu et al.
2010/0038785 A1*   2/2010  Cheng ............... H01L 21/76846
                                                        438/653
(Continued)

FOREIGN PATENT DOCUMENTS

CN    101736302 A    6/2010
CN    102779988 A    11/2012
(Continued)

OTHER PUBLICATIONS

Machine translation WO2016190415A1 (Year: 2016).*

*Primary Examiner* — Victoria H Lynch
(74) *Attorney, Agent, or Firm* — Bayramoglu Law Offices LLC

(57) ABSTRACT

A film and a manufacturing process thereof, including a base layer, where each of front and back sides of the base layer is provided with a bonding layer, a functional layer, and a protective layer in sequence; the functional layer is composed of a first composite copper layer and/or a second composite copper layer; the first composite copper layer is formed by repeating copper coating on a surface of the bonding layer 2 to 500 times; and the second composite copper layer is formed by repeating copper coating on a surface of the bonding layer 2 to 500 times. The film has low cost, simple process, and prominent appearance performance, and the present disclosure belongs to the technical field of energy storage unit materials.

25 Claims, 7 Drawing Sheets

(51) Int. Cl.
*C23C 14/14* (2006.01)
*C23C 28/00* (2006.01)
*C23C 28/02* (2006.01)
*C25D 3/38* (2006.01)
*H01M 4/04* (2006.01)

(52) U.S. Cl.
CPC ............ *C23C 28/345* (2013.01); *C23C 28/42* (2013.01); *C25D 3/38* (2013.01); *H01M 4/0423* (2013.01); *H01M 4/0428* (2013.01); *H01M 4/0438* (2013.01); *H01M 4/662* (2013.01)

(58) Field of Classification Search
CPC ... C23C 28/021; C23C 28/322; C23C 28/345; C23C 28/42; C25D 3/38; C25D 5/10; C25D 7/0614; H01M 10/052; H01M 4/0423; H01M 4/0428; H01M 4/0438; H01M 4/661; H01M 4/662; H01M 4/664; H01M 4/667; H01M 4/668; Y02E 60/10
See application file for complete search history.

(56) References Cited

U.S. PATENT DOCUMENTS

| | | | |
|---|---|---|---|
| 2018/0069172 A1 | 3/2018 | Fukunaga et al. | |
| 2018/0119301 A1* | 5/2018 | Kim | C25D 3/38 |
| 2018/0301709 A1 | 10/2018 | Qiu | |
| 2021/0005784 A1* | 1/2021 | Pickel | G02B 1/00 |

FOREIGN PATENT DOCUMENTS

| | | | | |
|---|---|---|---|---|
| CN | 102884660 A | 1/2013 | | |
| CN | 106972175 A | 7/2017 | | |
| CN | 107369810 A | 11/2017 | | |
| CN | 108624860 A | 10/2018 | | |
| EP | 3389122 A1 | 10/2018 | | |
| JP | 2011204677 A | 10/2011 | | |
| JP | 2012077330 A | 4/2012 | | |
| JP | 2018053340 A | 4/2018 | | |
| JP | 2018058362 A | 4/2018 | | |
| JP | 2018517253 A | 6/2018 | | |
| WO | 03083965 A2 | 10/2003 | | |
| WO | 03083965 A3 | 1/2004 | | |
| WO | WO-2016190415 A1 * | 12/2016 | | B32B 27/08 |
| WO | 2018168468 A1 | 9/2018 | | |

* cited by examiner

FILM AND PREPARATION PROCESS

TECHNICAL FIELD

The present disclosure belongs to the technical field of energy storage unit materials, and specifically relates to a film and a manufacturing process thereof.

BACKGROUND

With the development of industries and the depletion of fossil energy, the environmental pollution and energy shortage problems are getting worse, so it is necessary to find new energy sources and develop new energy-saving tools.

Copper foil is used as an anode material for lithium energy storage units, and the existing copper foil has a maximum thickness only of 6 μm. With the development of energy storage unit technology, there are higher requirements for the volume and weight of energy storage units, and an anode current collector structure for ultra-thin energy storage units has been gradually developed, where a copper layer is coated on a plastic base layer, achieving a preferred thickness. However, during a charging and discharging process of the energy storage units, the coated copper layer easily falls off from the plastic base layer due to a low bonding strength between the two layers.

A plated copper layer (namely, a functional layer) in the prior art is formed by a one-time plating process, that is, a copper layer with a required thickness is formed by electroplating at one time. The process is complicated and costly, and will cause a wrinkled film surface, many pinholes, low resistivity, and so on.

SUMMARY

An objective of the present disclosure is to overcome the problems existing in the prior art and provide a film with low cost, simple process, and prominent appearance performance.

Another objective of the present disclosure is to provide a simple manufacturing process of the film with low cost and prominent appearance performance.

The present disclosure adopts the following technical solutions:

The present disclosure provides a film including a base layer, where each of front and back sides of the base layer is provided with a bonding layer, a functional layer, and a protective layer in sequence; the functional layer is composed of a first composite copper layer and a second composite copper layer; the first composite copper layer is formed by repeating copper coating on a surface of the bonding layer 1 to 500 times; and the second composite copper layer is formed by repeating copper coating on a surface of the first composite copper layer 1 to 500 times.

The first composite copper layer may be formed by repeating a physical vapor deposition (PVD) process 1 to 30 times, and the second composite copper layer may be formed by repeating an electroplating process 1 to 10 times.

The functional layer may be composed of the first composite copper layer and the second composite copper layer at an outer side of the first composite copper layer; the first composite copper layer may be first deposited on the bonding layer, and then the second composite copper layer may be plated on the first composite copper layer; and a thickness of the first composite copper layer may be smaller than a thickness of the second composite copper layer.

The first composite copper layer and the second composite copper layer may have a total thickness of 30 nm to 2,500 nm.

The present disclosure also provides a film including a base layer, where each of front and back sides of the base layer is provided with a bonding layer, a functional layer, and a protective layer in sequence; the functional layer is composed of a first composite copper layer; and the first composite copper layer is formed by repeating copper coating on a surface of the bonding layer 2 to 500 times.

The first composite copper layer may have a thickness of 15 nm to 1,500 nm.

The present disclosure also provides a film including a base layer, where each of front and back sides of the base layer is provided with a bonding layer, a functional layer, and a protective layer in sequence; the functional layer is composed of a second composite copper layer; and the second composite copper layer is formed by repeating copper coating on a surface of the bonding layer 2 to 500 times.

The second composite copper layer may have a thickness of 15 nm to 1,500 nm. The bonding layer may be a metallic material layer, and a metal for the metallic material layer may be one from the group consisting of Ti, W, Cr, Ni, Ni alloy, and Cr alloy.

The bonding layer may be a non-metallic material layer, and a material for the non-metallic material layer may be one from the group consisting of PVDC, NIO, Si, PTFE, PP, PE, SiC, $Si_3N_4$, $SiO_x$ ($1.5 \leq x \leq 2$), $AlO_x$ ($1 \leq x \leq 1.5$), $AlO_x$ ($1 \leq x \leq 1.5$), and tripolycyanamide.

The bonding layer may be a composite material layer composed of a metallic material layer and a non-metallic material layer; a metal for the metallic material layer may be one from the group consisting of Ti, W, Cr, Ni, Ni alloy, and Cr alloy; and a material for the non-metallic material layer may be one from the group consisting of PVDC, NIO, Si, PTFE, PP, PE, SiC, $Si_3N_4$, $SiO_x$ ($1.5 \leq x \leq 2$), $AlO_x$ ($1 \leq x \leq 1.5$), $AlO_x$ ($1 \leq x \leq 1.5$), and tripolycyanamide.

The metallic material layer may be composed of 1 to 10 metallic material layers.

The metallic material layer may be composed of 1 to 2 metallic material layers.

A metal for the metallic material layer may be the Ni alloy, and the Ni alloy may be one from the group consisting of NiCu alloy, NiCr alloy, and NiV alloy; and in mass percentage, the NiCu alloy may be composed of 60% to 80% of Ni and 20% to 40% of Cu, the NiCr alloy may be composed of 70% to 90% of Ni and 10% to 30% of Cr, and the NiV alloy may be composed of 80% to 95% of Ni and 5% to 20% of V.

A metal for the metallic material layer may be the Cr alloy, and the Cr alloy may be one from the group consisting of CrCu alloy, CrV alloy, and CrCo alloy; and in mass percentage, the CrCu alloy is composed of 60% to 90% of Cr and 10% to 40% of Cu, the CrV alloy is composed of 40% to 80% of Cr and 20% to 60% of V, and the CrCo alloy is composed of 60% to 90% of Cr and 10% to 40% of Co. The metallic material layer may have a thickness of 3 nm to 40 nm.

When a non-metallic material for the non-metallic material layer is $SiO_x$ ($1.5 \leq x \leq 2$), the non-metallic material layer may have a thickness of 10 nm to 40 nm.

When a non-metallic material for the non-metallic material layer is $AlO_x$ ($1 \leq x \leq 1.5$), the non-metallic material layer may have a thickness of 3 nm to 40 nm.

The non-metallic material layer may be provided in 1 to 10 layers.

The non-metallic material layer may be provided in 1 to 2 layers.

The non-metallic material layer may have a thickness of 3 nm to 40 nm.

The metallic material layer may be provided in 1 to 10 layers; and the non-metallic material layer may be provided in 1 to 10 layers.

The metallic material layer may have a thickness of 1.5 nm to 28.5 nm; and the non-metallic material layer may have a thickness of 1.5 nm to 30 nm.

The protective layer may be a metallic material layer, and a metal for the metallic material layer may be one from the group consisting of Cr, Ni, Ni alloy, and Cr alloy.

The protective layer may be a non-metallic material layer, and a non-metallic material for the non-metallic material layer may be one from the group consisting of glucose complex and potassium dichromate.

The protective layer may be provided at an outer side of the functional layer and may be formed by repeating a coating process 1 to 20 times.

The protective layer may have a thickness of 2 nm to 100 nm.

The base layer may be made of one or more materials from the group consisting of OPP, PET, PI, PS, PPS, CPP, PEN, PVC, SPS, PEEK, PES, PPSU, and non-woven fabric. When the base layer is made of two or more materials, the two or more materials are subjected to co-extrusion to form the base layer.

The base layer may have a thickness of 1.2 μm to 12 μm.

The base layer may preferably have a thickness of 1.2 μm to 6 μm.

The other objective of the present disclosure is achieved by the following technical solutions.

A manufacturing process of a film is provided, including the following steps:

step 1. forming a bonding layer on a base layer;

step 2. forming a functional layer at an outer side of the bonding layer, where the functional layer is a composite copper layer, which is a first composite copper layer formed by repeating copper coating 2 to 500 times; and step 3. forming a metallic material protective layer or a non-metallic material protective layer at an outer side of the functional layer.

A manufacturing process of a film is provided, including the following steps:

step 1. forming a bonding layer on a base layer;

step 2. forming a functional layer at an outer side of the bonding layer, where the functional layer is a composite copper layer, which is a second composite copper layer formed by repeating copper coating 2 to 500 times; and step 3. forming a protective layer at an outer side of the functional layer.

A manufacturing process of a film is provided, including the following steps:

step 1. forming a bonding layer on a base layer;

step 2. forming a functional layer at an outer side of the bonding layer, where the functional layer is composed of a first composite copper layer and a second composite copper layer;

the first composite copper layer is formed by repeating copper coating on the bonding layer 1 to 500 times; and the second composite copper layer is formed by repeating copper coating on the first composite copper layer 2 to 500 times; and step 3. forming a metallic material protective layer or a non-metallic material protective layer at an outer side of the functional layer.

In the step 1, the bonding layer may be formed on each of front and back sides of the base layer by one from the group consisting of a PVD process, a chemical vapor deposition (CVD) process, and an atomic layer deposition (ALD) process.

In the step 2, a copper layer may be formed on a surface of the bonding layer on the base layer obtained in the step 1 by one from the group consisting of a PVD process, a galvanic plating process, and a CVD process; and 5 nm to 2,500 nm may be deposited each time according to actual needs and it may be repeated 2 to 500 times to obtain a functional layer with a required total thickness.

In the step 3, a protective layer may be formed on a surface of the functional layer on the bonding layer obtained in the step 2 by one from the group consisting of a PVD process, a CVD process, an electroplating process, and a surface coating process.

When the bonding layer is a metallic material layer, the metallic material layer may be formed by a magnetron sputtering process; and when the bonding layer is a non-metallic material layer, the non-metallic material layer may be formed by one from the group consisting of a CVD process and an ALD process, and the CVD process may include one from the group consisting of direct CVD reaction to produce oxides, CVD ion-assisted oxidation, CVD reaction to produce other compounds, and magnetron oxidation reaction.

When the functional layer is composed of a first composite copper layer and a second composite copper layer, the first composite copper layer may be formed by one from the group consisting of a PVD process and a CVD process, and the second composite copper layer may be formed by one from the group consisting of a galvanic plating process and a chemical plating process.

When a surface layer of the functional layer is the first composite copper layer, the protective layer is a metallic material layer; and when a surface layer of the functional layer is the second composite copper layer, the protective layer is a non-metallic material layer.

When the protective layer is a metallic material layer, the metallic material layer is formed by a PVD process; and when the protective layer is a non-metallic material layer, the non-metallic material layer is formed by one from the group consisting of a galvanic plating process and a surface coating process. The present disclosure has the following beneficial effects:

1. In the present disclosure, a composite copper layer is used instead of the original single copper layer, which involves greatly reduced manufacturing cost, simple process, and high manufacturing efficiency; and multiple processes are used instead of a single process, which leads to high copper coating efficiency and low cost. Therefore, the complexity, difficulty, and cost of the process are greatly reduced and the efficiency of copper coating is improved.

2. The present disclosure can make a product have an unwrinkled film surface, less pinholes and defects, and prominent appearance performance while ensuring the conductive performance of the product.

3. A film formed by the present disclosure is conductive on both sides, which has a sheet resistance of 10,000-5 mΩ, a film surface resistivity of $1.8\times10$ E-8 to $2.5\times10$ E-8 Ω·m, an elongation at break of ≥6% in TD/MD, a tensile strength of ≥200 MPa in TD/MD, and a surface tension coefficient (dyne) of ≥42.

Figure 1:
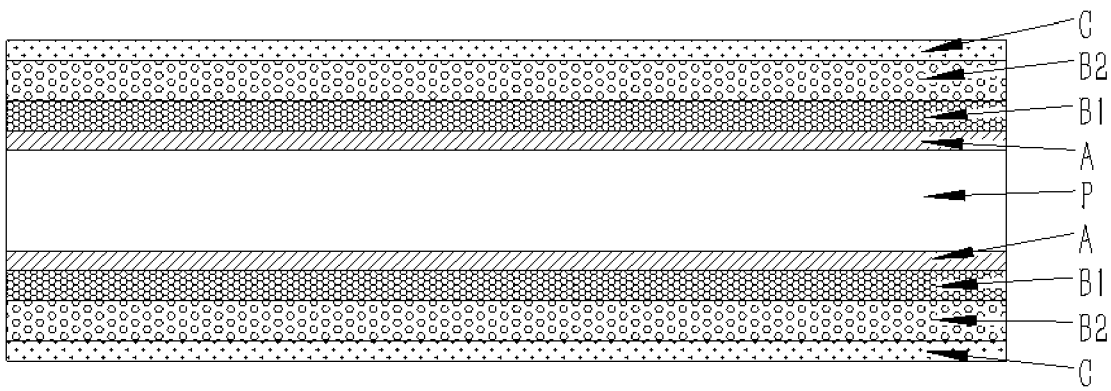
FIG. 1 is a schematic diagram of the PAB1B2C structure of the present disclosure.

Reference numerals in the drawings are as follows:

P represents a base layer, A1 represents a metallic material bonding layer, A2 represents a non-metallic material bonding layer, B1 represents a first composite copper layer, B2 represents a second composite copper layer, C1 represents a metallic material protective layer, and C2 represents a non-metallic material protective layer.

DETAILED DESCRIPTION OF THE EMBODIMENTS

To make the objectives, technical solutions, and advantages of the present disclosure clearer, the present disclosure is further described in detail below with reference to the accompanying drawings and examples. It should be understood that the specific examples described herein are merely intended to explain the present disclosure, rather than to limit the present disclosure.

Example 1

A shown in FIG. 1, a film is provided. The film includes a base layer, where each of front and back sides of the base layer is provided with a bonding layer, a functional layer, and a protective layer in sequence; and the functional layer is composed of a first composite copper layer and/or a second composite copper layer.

In the solution of this example, the functional layer is composed of a first composite copper layer, and the first composite copper layer may be formed by repeating a deposition process 2 to 500 times.

The one-time plating is changed into multi-time plating. That is, a copper layer with a small thickness is plated each time, and the plating process is repeated 2 to 500 times, such that a film meeting electrical conductivity requirements is obtained with a simplified process and a reduced cost and a surface of the film has no wrinkles, no pinholes, and prominent appearance performance. A film formed in this example is conductive on both sides, which has a sheet resistance of 10,000-5 m$\Omega$, a film surface resistivity of $1.8 \times 10$ E-8 to $2.5 \times 10$ E-8 $\Omega \cdot m$, an elongation at break of $\geq 3\%$ in TD/MD, a tensile strength of $\geq 200$ MPa in TD/MD, and a surface tension coefficient (dyne) of $\geq 38$.

According to test results, the sheet resistance and resistivity of the above functional layer meet the manufacturing parameter requirements of energy storage units and the performance requirements of ultra-thin anode current collectors.

The parameters and appearance performance of the first composite copper layers obtained by repeating coating different times are shown in the table below.

| Number of times | 2 | 4 | 50 | 100 | 300 | 500 |
|---|---|---|---|---|---|---|
| Process | PVD | PVD | PVD | PVD | PVD | PVD |
| Thickness | 1,500 nm | 1,500 nm | 1,500 nm | 1,500 nm | 1,500 nm | 1,500 nm |
| Cost | 100% | 100% | 127% | 180% | 400% | 600% |
| Pinhole | none | none | none | none | none | none |
| Thickness consistency | $\leq \pm 5\%$ | $\leq \pm 5\%$ | $\leq \pm 10\%$ | $\leq \pm 10\%$ | $\leq \pm 10\%$ | $\leq \pm 10\%$ |

It can be seen from the above data that, during the manufacturing of the first composite copper layers at the same thickness, the more the number of coating times, the greater the increase in process cost, and the lower the thickness consistency, but the appearance performance of the first composite copper layer always remains excellent. Therefore, it is preferable to repeat 2 to 30 times.

When the functional layer is the first composite copper layer, the first composite copper layer may have a thickness of 15 nm to 1,500 nm.

A manufacturing process of a film is provided, including the following steps:

step 1. a bonding layer is formed on a base layer;

step 2. a functional layer is formed at an outer side of the bonding layer, where the functional layer is a composite copper layer, which is a first composite copper layer formed by repeating copper coating 2 to 500 times; and step 3. a metallic material protective layer or a non-metallic material protective layer is formed at an outer side of the functional layer.

Example 2

Figure 2:
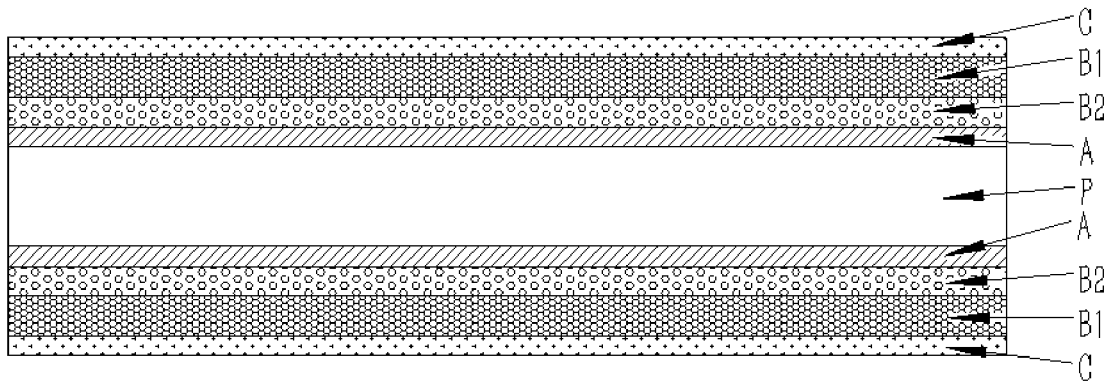
FIG. 2 is a schematic diagram of the PAB2B1C structure of the present disclosure.

One of the implementations of the film of the present disclosure is provided, as shown in FIG. 2. The main technical solution of this example is basically the same as that of Example 1. The features that are not explained in this example can be comprehended according to the explanations in Example 1, which will not be repeated here. This example is different from Example 1 in that: in the solution of this example, the functional layer is composed of a second composite copper layer, and the second composite copper layer may be formed by repeating a deposition process 2 to 500 times.

The functional layer may be formed by repeating a coating process 2 to 500 times.

When the functional layer is the second composite copper layer, the second composite copper layer may have a thickness of 15 nm to 1,500 nm.

During the manufacturing of the second composite copper layers at the same thickness, the more the number of coating times, the greater the increase in process cost. It is preferable to repeat 2 to 50 times.

step 1. forming a bonding layer on a base layer;

step 2. a functional layer is formed at an outer side of the bonding layer, where the functional layer is a composite copper layer, which is a second composite copper layer formed by repeating copper coating 2 to 500 times; and step 3. a protective layer is formed at an outer side of the functional layer.

Example 3

Figure 3:
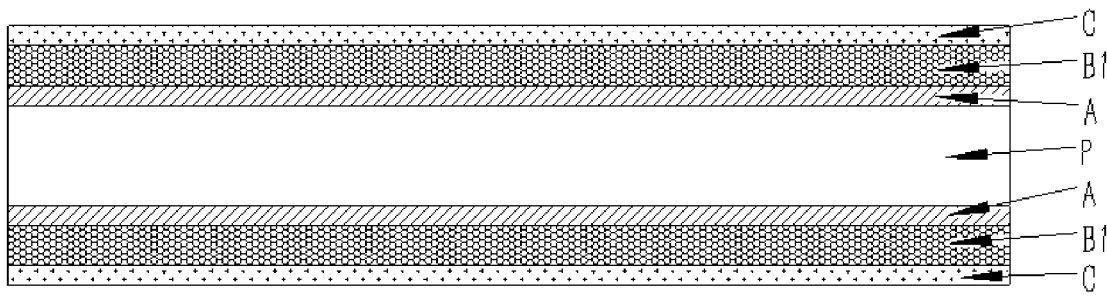
FIG. 3 is a schematic diagram of the PAB1C structure of the present disclosure.
Figure 4:
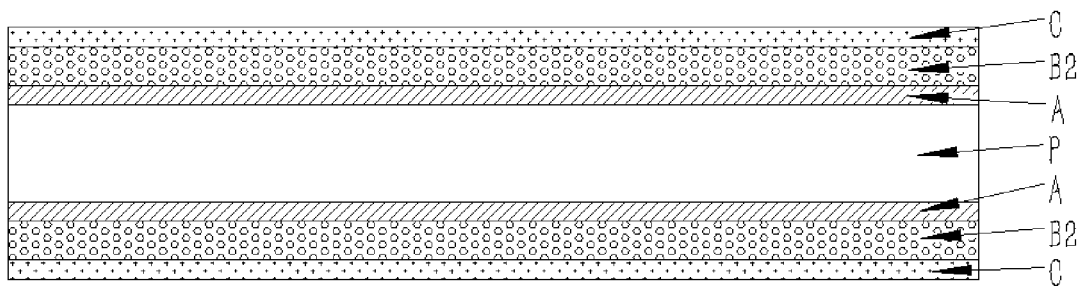
FIG. 4 is a schematic diagram of the PAB2C structure of the present disclosure.
Figure 5:
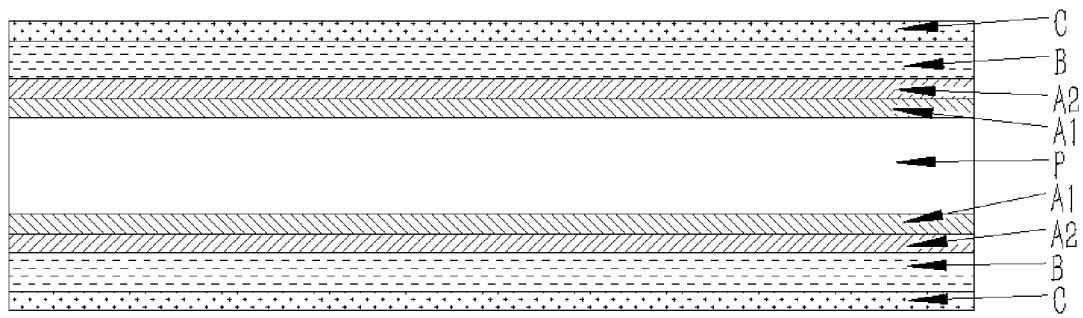
FIG. 5 is a schematic diagram of the PA1A2BC structure of the present disclosure.
Figure 6:
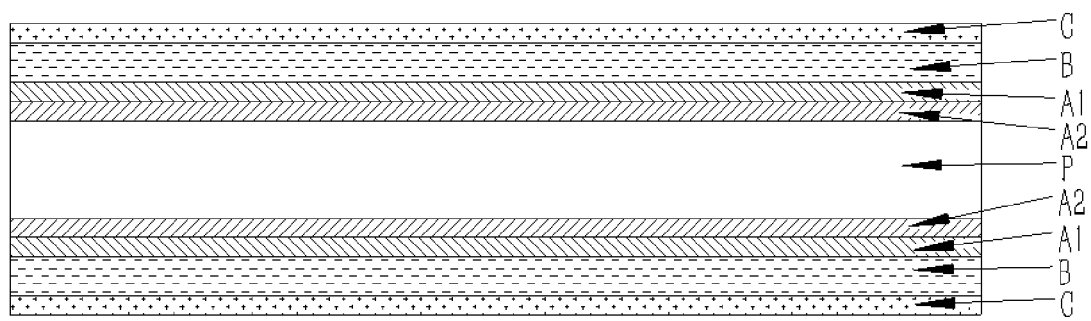
FIG. 6 is a schematic diagram of the PA2A1BC structure of the present disclosure.
Figure 7:
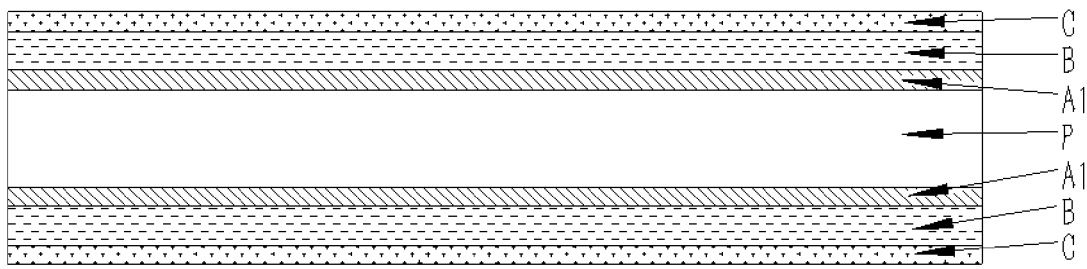
FIG. 7 is a schematic diagram of the PA1BC structure of the present disclosure.
Figure 8:
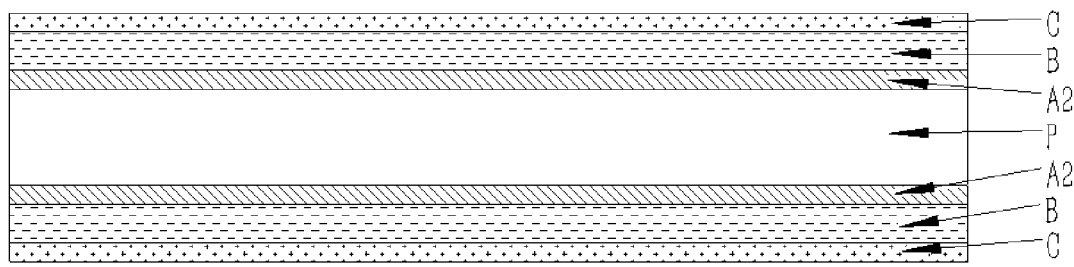
FIG. 8 is a schematic diagram of the PA2BC structure of the present disclosure.
Figure 9:
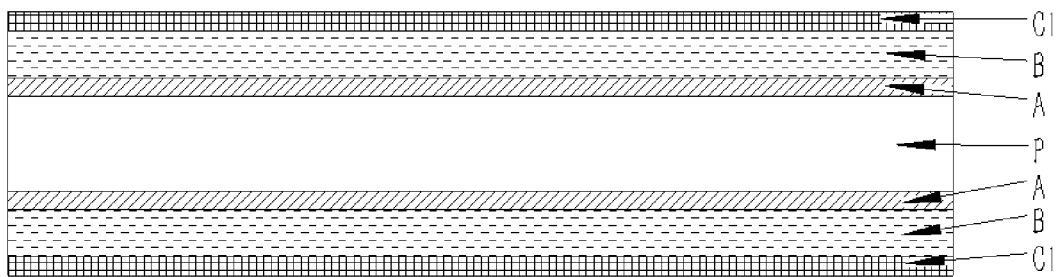
FIG. 9 is a schematic diagram of the PABC1 structure of the present disclosure.
Figure 10:
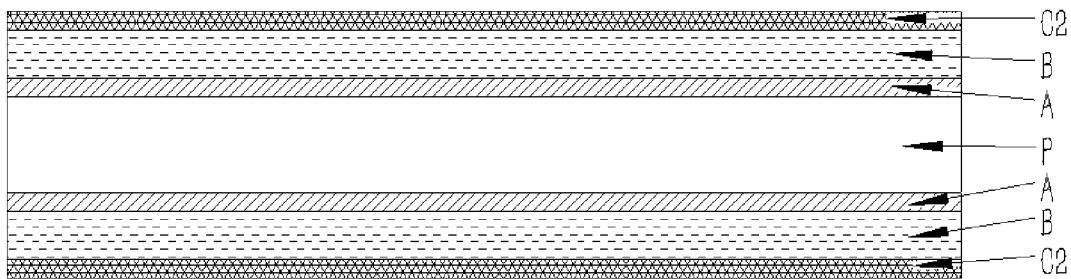
FIG. 10 is a schematic diagram of the PABC2 structure of the present disclosure.
Figure 11:
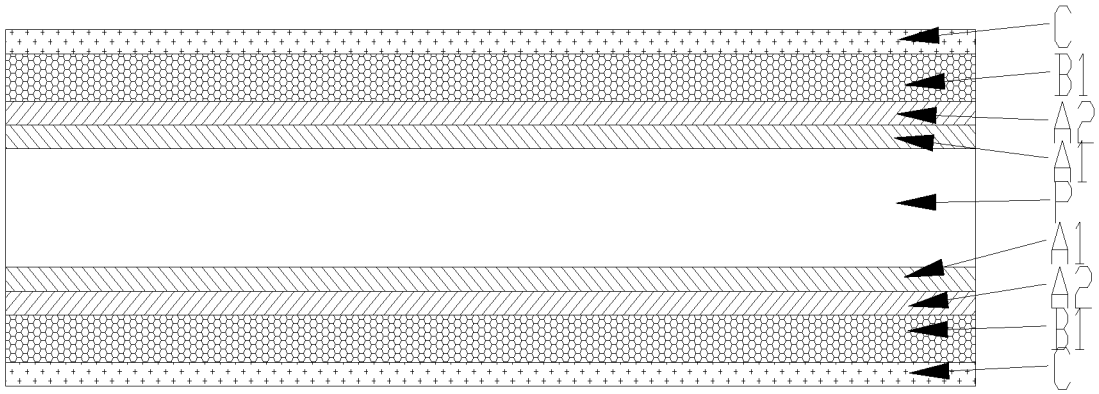
FIG. 11 is a schematic diagram of the PA1A2B1C structure of the present disclosure.
Figure 12:
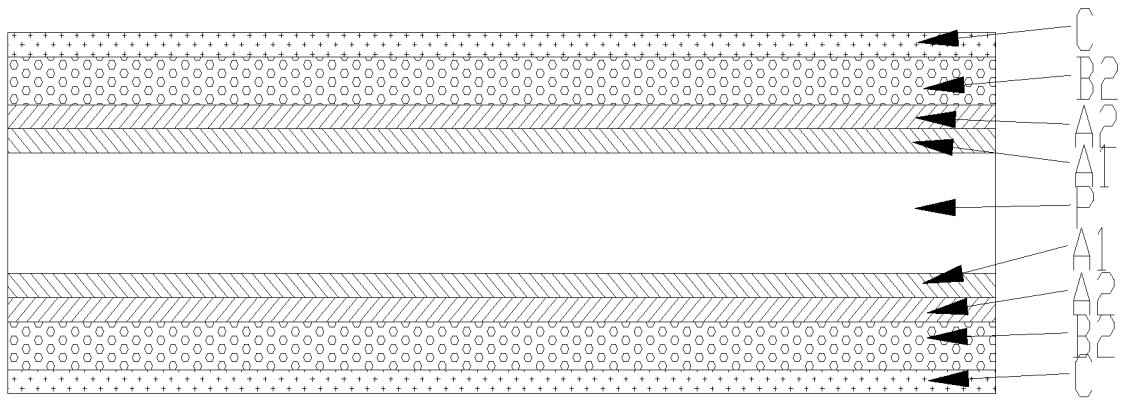
FIG. 12 is a schematic diagram of the PA1A2B2C structure of the present disclosure.
Figure 13:
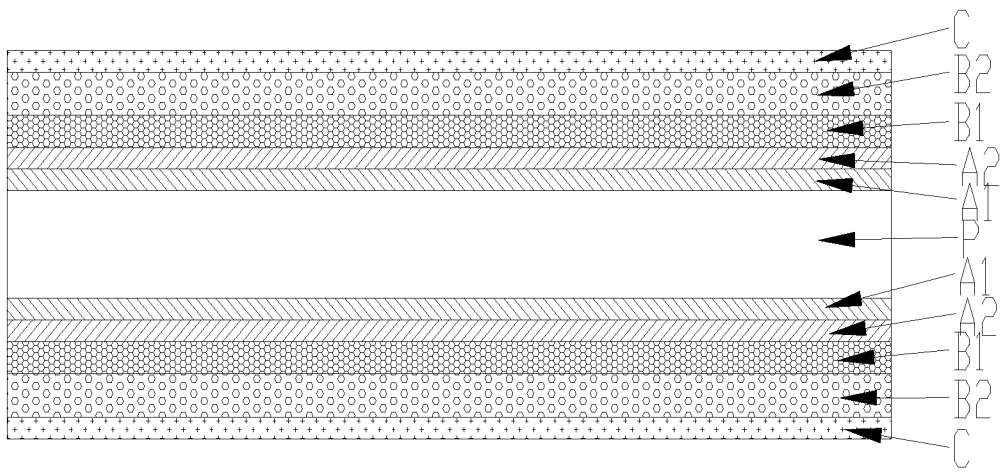
FIG. 13 is a schematic diagram of the PA1A2B1B2C structure of the present disclosure.
Figure 14:
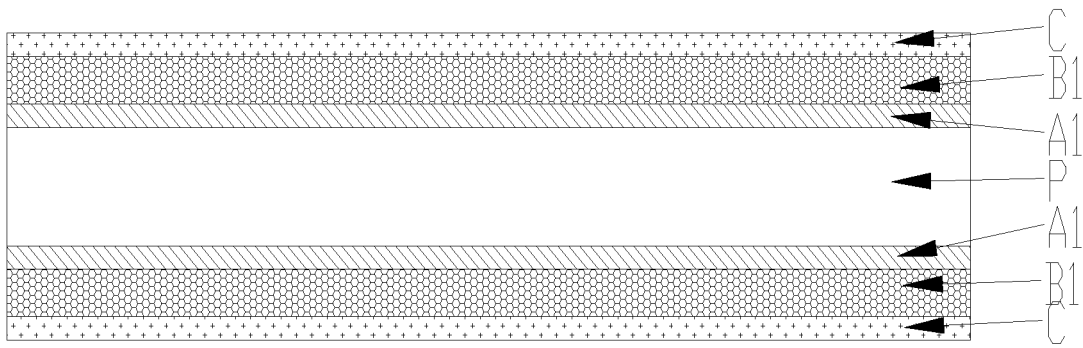
FIG. 14 is a schematic diagram of the PA1B1C structure of the present disclosure.
Figure 15:
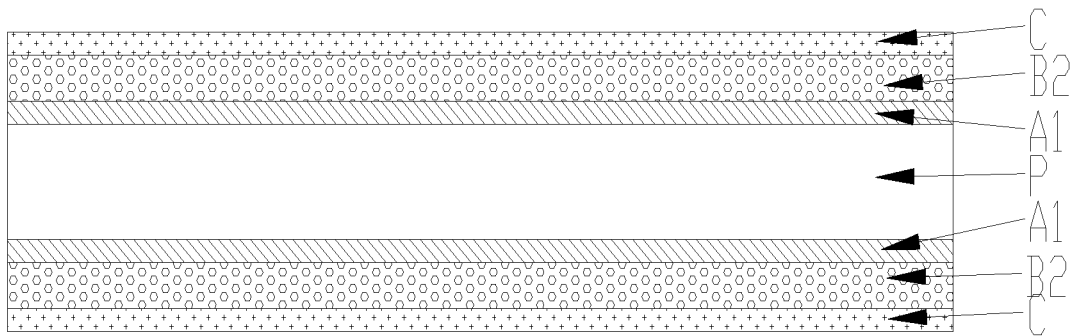
FIG. 15 is a schematic diagram of the PA1B2C structure of the present disclosure.
Figure 16:
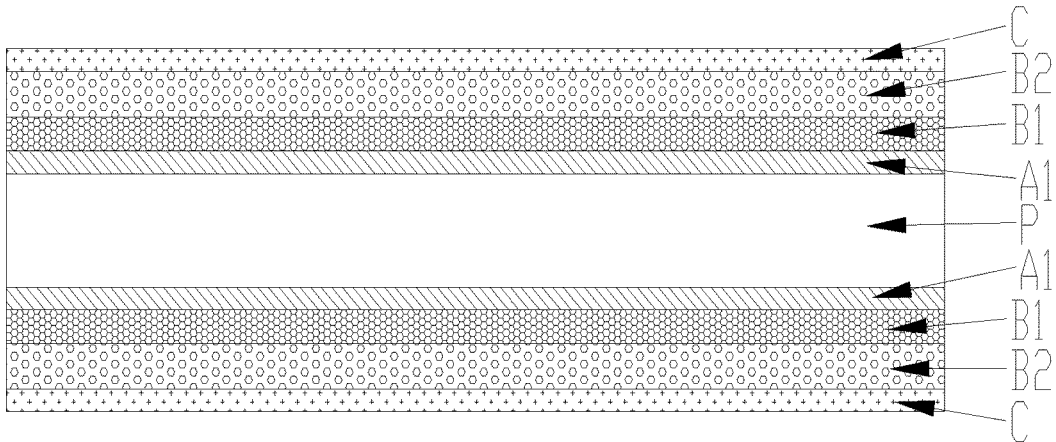
FIG. 16 is a schematic diagram of the PA1B1B2C structure of the present disclosure.
Figure 17:
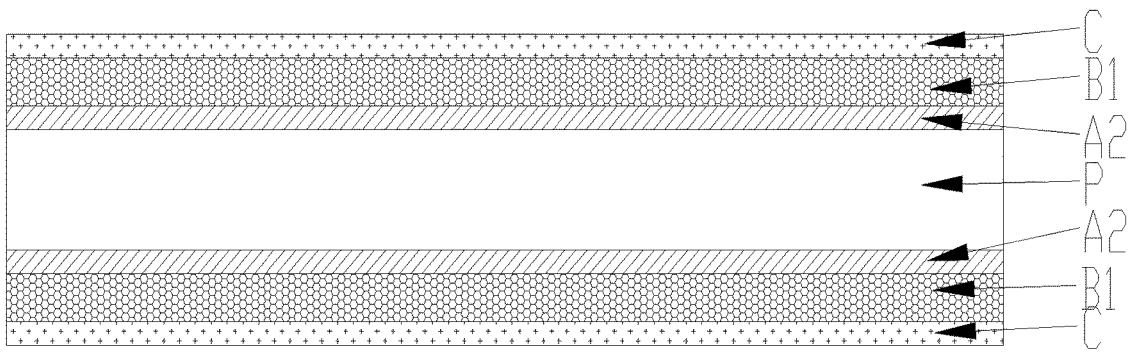
FIG. 17 is a schematic diagram of the PA2B1C structure of the present disclosure.
Figure 18:
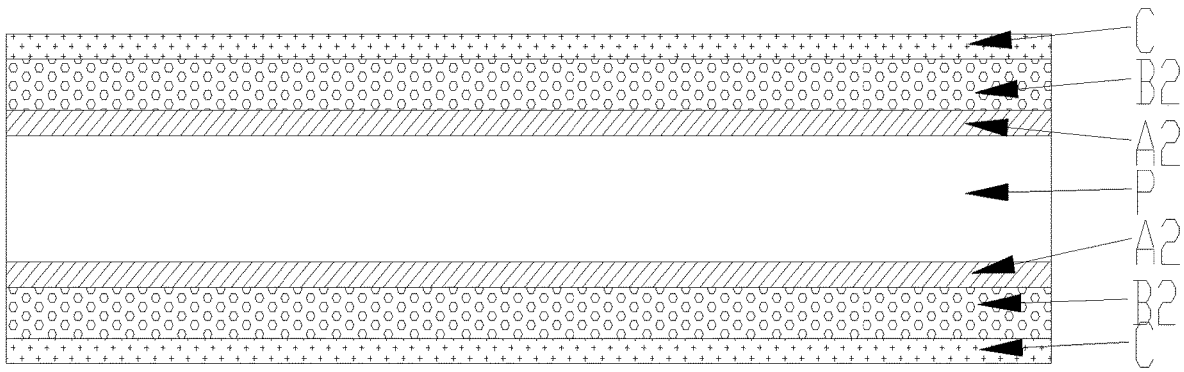
FIG. 18 is a schematic diagram of the PA2B2C structure of the present disclosure.
Figure 19:
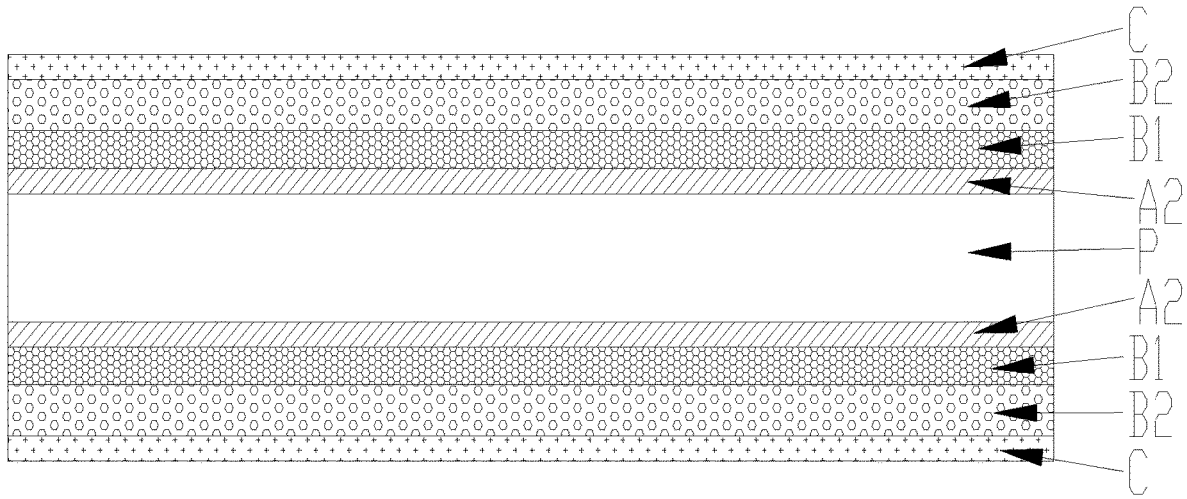
FIG. 19 is a schematic diagram of the PA2B1B2C structure of the present disclosure.
Figure 20:
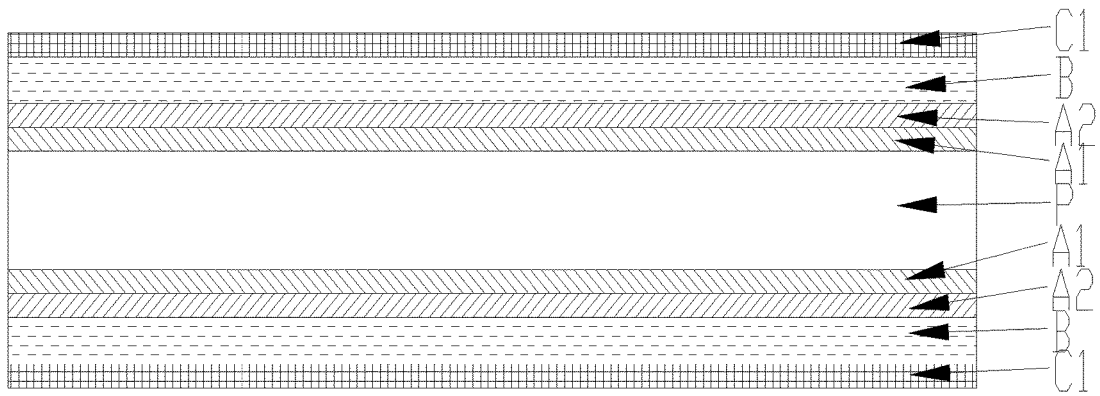
FIG. 20 is a schematic diagram of the PA1A2BC1 structure of the present disclosure.
Figure 21:
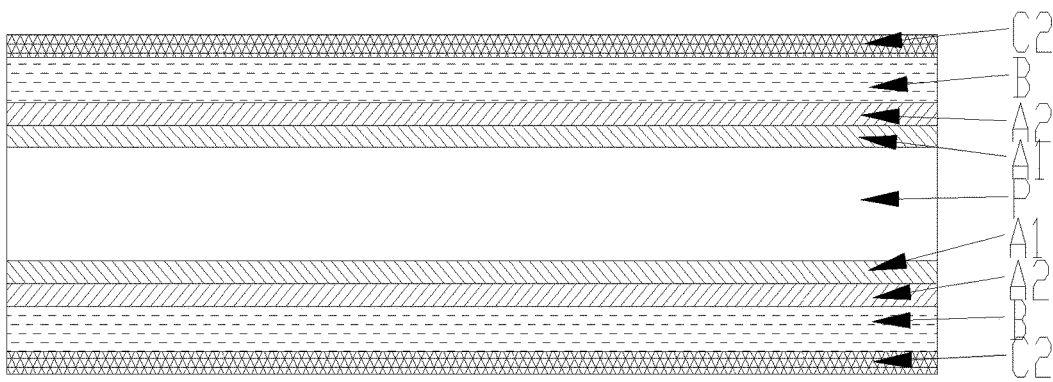
FIG. 21 is a schematic diagram of the PA1A2BC2 structure of the present disclosure.
Figure 22:
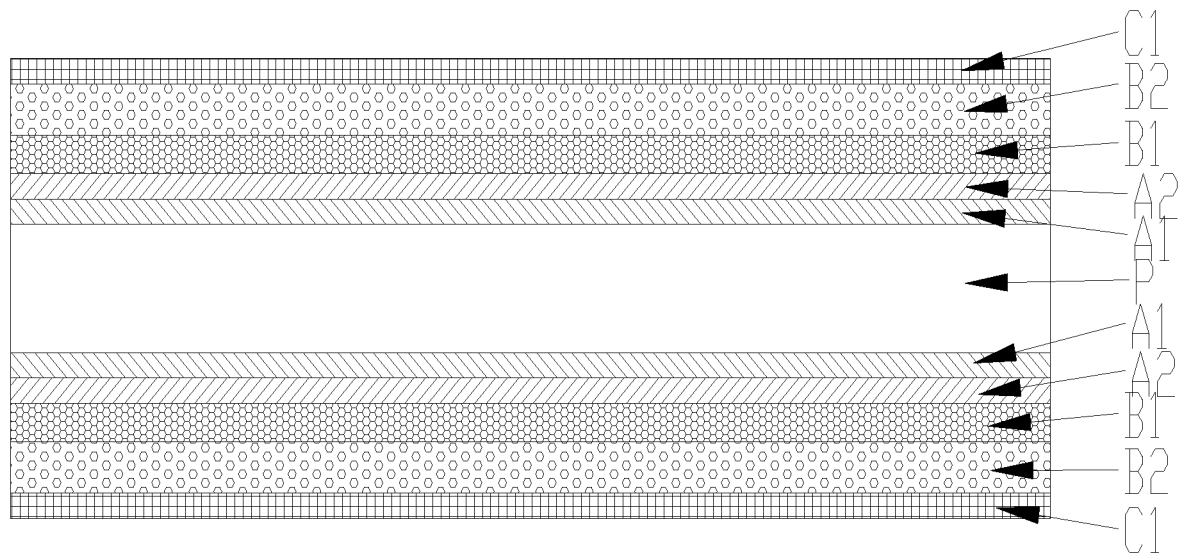
FIG. 22 is a schematic diagram of the PA1A2B1B2C1 structure of the present disclosure.
Figure 23:
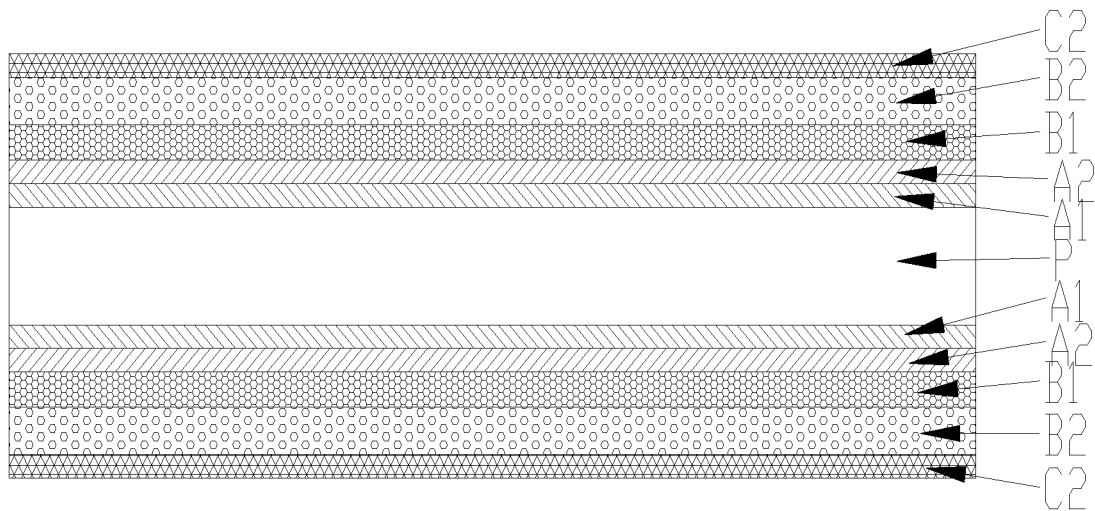
FIG. 23 is a schematic diagram of the PA1A2B1B2C2 structure of the present disclosure.

One of the implementations of the film of the present disclosure is provided, as shown in FIG. 3. The main technical solution of this example is basically the same as that of Examples 1 and 2. The features that are not explained in this example can be comprehended according to the explanations in Examples 1 and 2, which will not be repeated here. This example is different from Examples 1 and 2 in that this example is the optimal example. In the solution of this example, the functional layer is composed of a first composite copper layer and a second composite copper layer. The first composite copper layer may be formed by repeating a PVD process 1 to 500 times, and the second composite copper layer may be formed by repeating an electroplating process 1 to 500 times.

Preferably, the first composite copper layer may be formed by repeating a deposition process 1 to 30 times, and the second composite copper layer may be formed by repeating a coating process 1 to 10 times.

The functional layer may be composed of a first composite copper layer and a second composite copper layer at an outer side of the first composite copper layer; the first composite copper layer may be first deposited on the bond-

| Number of times | 2 | 4 | 50 | 100 | 300 | 500 |
|---|---|---|---|---|---|---|
| Process | Electroplating | Electroplating | Electroplating | Electroplating | Electroplating | Electroplating |
| Thickness | 1,500 nm | 1,500 nm | 1,500 nm | 1,500 nm | 1,500 nm | 1,500 nm |
| Cost | 100% | 100% | 127% | 180% | 400% | 600% |
| Pinhole | none | none | none | none | none | none |
| Thickness consistency | ≤±5% | ≤±5% | ≤±10% | ≤±10% | ≤±10% | ≤±10% |

The bonding layer may be a non-metallic material layer, and a non-metallic material for the non-metallic material layer may be one from the group consisting of PTFE, PP, PE, SiC, $Si_3N_4$, $SiO_x$ (1.5≤x≤2), $AlO_x$ (1≤x≤1.5), $AlO_x$ (1≤x≤1.5), and tripolycyanamide. The use of the non-metallic material layer as the bonding layer allows the bonding layer to have prominent chemical stability, corrosion resistance, and effectively improved stability in an energy storage unit structure, which prolongs a service life of the entire anode current collector.

The non-metallic material layer may be provided in 1 to 10 layers; and preferably, the non-metallic material layer may be provided in 1 to 2 layers. The non-metallic material layer with this design has prominent performance, low cost, and simple process.

The non-metallic material layer may have a thickness of 3 nm to 30 nm. A manufacturing process of a film is provided, including the following steps:

ing layer, and then the second composite copper layer may be plated on the first composite copper layer; and a thickness of the first composite copper layer may be smaller than a thickness of the second composite copper layer. The PVD process requires a higher cost than the electroplating process. Therefore, when a thickness of the first composite copper layer is smaller than a thickness of the second composite copper layer, a total manufacturing cost can be effectively reduced. When the composite copper layer includes a first composite copper layer and a second composite copper layer, the first composite copper layer may be formed by one from the group consisting of a PVD process and a CVD process, and the second composite copper layer may be formed by one from the group consisting of a galvanic plating process and a chemical plating process.

When the functional layer is composed of the first composite copper layer and the second composite copper layer, the first composite copper layer and the second composite copper layer may have a total thickness of 30 nm to 2,500 nm.

|  | One-time plating | First composite copper layer | Second composite copper layer | First composite copper layer + second composite copper layer |
| --- | --- | --- | --- | --- |
| Number of times | 1 | 2 to 50 | 2 to 10 | 2 to 50 |
| Process | Electroplating | PVD | Electroplating | PVD + electroplating |
| Thickness | 1,500 nm | 1,500 nm | 1,500 nm | 1,500 nm |
| Sheet resistivity | ≤5.5 × 10E−8 Ω·m | ≤5.5 × 10E−8 Ω·m | ≤2.5 × 10E−8 Ω·m | ≤5.5 × 10E−8 Ω·m |
| Cost | 200% | 200% | 120% | 100% |
| Appearance | A film surface is easily deformed and wrinkled and has poor quality, which cannot meet product requirements | A film surface is easily deformed and is not wrinkled, which can meet product requirements | Excellent appearance quality | Excellent appearance quality |
| Pinhole | many | none | none | none |

Comparison data for functional layers (composed of the first composite copper layer and the second composite copper layer) at the same thickness manufactured by repeating coating different times are shown in the table below.

| Number of times | 2 | 4 | 50 | 100 | 300 | 500 |
| --- | --- | --- | --- | --- | --- | --- |
| Process | PVD + electroplating | PVD + electroplating | PVD + electroplating | PVD + electroplating | PVD + electroplating | PVD + electroplating |
| Thickness | 1,000 nm | 1,000 nm | 1,000 nm | 1,000 nm | 1,000 nm | 1,000 nm |
| Thickness from PVD process | 20 | 80 | 400 | 600 | 800 | 980 |
| Thickness from electroplating process | 980 | 920 | 600 | 400 | 200 | 20 |
| Cost | 100% | 100.61% | 127% | 180% | 400% | 600% |
| Pinhole | yes | none | none | none | none | none |
| Thickness consistency | ≤±5% | ≤±5% | ≤±10% | ≤±10% | ≤±10% | ≤±10% |
| Resistivity | ≤2.5 × 10E−8 Ω·m | ≤2.5 × 10E−8 Ω·m | ≤4.2 × 10E−8 Ω·m | ≤4.4 × 10E−8 Ω·m | ≤4.8 × 10E−8 Ω·m | ≤5.5 × 10E−8 Ω·m |

The bonding layer may be a composite material layer composed of a metallic material layer and a non-metallic material layer; a metal for the metallic material layer may be one from the group consisting of Cr, Ni alloy, and Cr alloy; and a non-metallic material for the non-metallic material layer may be one from the group consisting of PTFE, PP, PE, SiC, $Si_3N_4$, $SiO_x$ ($1.5 \leq x \leq 2$), $AlO_x$ ($1 \leq x \leq 1.5$), $AlO_x$ ($1 \leq x \leq 1.5$), and tripolycyanamide. The composite material layer composed of a metallic material layer and a non-metallic material layer has both the electrical conductivity and physical properties of the metallic material layer and the corrosion resistance of the non-metallic material layer. When in use, the composite material layer can effectively ensure the bonding strength, and has a wide application range and excellent performance.

A cost of the bonding layer is greatly reduced. Compared with nickel, the use of alloy and non-metallic material can reduce the cost of the bonding layer by about 20% and increase the deposition efficiency by 20%.

The metallic material layer may be composed of 1 to 10 metallic material layers. The metallic material layer of the present disclosure may be formed by depositing a metallic material on a surface of a plastic base layer through a coating or deposition process.

The metallic material layer may be composed of 1 to 2 metallic material layers. Based on the bonding strength and process cost, 1 to 2 layers are preferred.

A metal for the metallic material layer may be the Ni alloy, and the Ni alloy may be one from the group consisting of NiCu alloy, NiCr alloy, and NiV alloy; and A metal for the metallic material layer may be the Ni alloy, and the Ni alloy may be one from the group consisting of NiCu alloy, NiCr alloy, and NiV alloy; and in mass percentage, the NiCu alloy may be composed of 60% to 80% of Ni and 20% to 40% of Cu, the NiCr alloy may be composed of 70% to 90% of Ni and 10% to 30% of Cr, and the NiV alloy may be composed of 80% to 95% of Ni and 5% to 20% of V.

A metal for the metallic material layer may be the Cr alloy, and the Cr alloy may be one from the group consisting of CrCu alloy, CrV alloy, and CrCo alloy; and in mass percentage, the CrCu alloy may be composed of 60% to 90% of Cr and 10% to 40% of Cu, the CrV alloy may be composed of 40% to 80% of Cr and 20% to 60% of V, and the CrCo alloy may be composed of 60% to 90% of Cr and 10% to 40% of Co.

When the chromium alloy with the above composition is used, the deposition efficiency is increased by about 20%, and the process difficulty is greatly reduced.

The metallic material layer may have a thickness of 3 nm to 30 nm. A metallic material layer obtained by the above solution has prominent square resistance, high stability, low cost (a raw material cost can be reduced by about 50%), and a small thickness. With repeated deposition or plating, a layer with both high bonding strength and small thickness can be manufactured, with reduced raw material cost.

The metallic material layer may be provided in 1 to 10 layers; and the non-metallic material layer may be provided in 1 to 10 layers.

The metallic material layer may be provided in 1 to 2 layers; and the non-metallic material layer may be provided in 1 to 2 layers. When this design is adopted, both advantageous cost and performance can be achieved.

The metallic material layer may have a thickness of 1.5 nm to 28.5 nm; the non-metallic material layer may have a thickness of 1.5 nm to 30 nm, and when a material for the non-metallic material layer is $AlO_x$ ($1 \leq x \leq 1.5$), the non-metallic material layer may have a thickness of 8 nm to 15 nm; and the bonding layer may have a thickness of 3 nm to 40 nm.

Example 4

One of the implementations of the film of the present disclosure is provided. The main technical solution of this example is basically the same as that of Examples 1, 2, and 3. The features that are not explained in this example can be comprehended according to the explanations in Examples 1, 2, and 3, which will not be repeated here. This example is different from Examples 1, 2, and 3 in that:

The base layer may be made of one or more materials from the group consisting of OPP, PET, PI, PS, PPS, CPP, PEN, PVC, SPS, PEEK, PES, PPSU, and non-woven fabric. When the base layer is made of two or more materials, the two or more materials are subjected to co-extrusion to form the base layer. The above-mentioned base layer materials have excellent physical and chemical properties, small thickness, and prominent workability.

The base layer may have a thickness of 1.2 μm to 12 μm. The base layer may preferably have a thickness of 1.2 μm to 6 μm.

Example 5

One of the implementations of the film of the present disclosure is provided. The main technical solution of this example is basically the same as that of Examples 1, 2, and 3. The features that are not explained in this example can be comprehended according to the explanations in Examples 1, 2, and 3, which will not be repeated here. This example is different from Examples 1, 2, and 3 in that:

The protective layer may be a metallic material layer, and a metal for the metallic material layer may be one from the group consisting of Ni, Cr, Ni alloy, and Cr alloy. The protective layer may also be a non-metallic material layer, and a non-metallic material for the non-metallic material layer may be one from the group consisting of glucose complex and potassium dichromate.

The protective layer may be provided at an outer side of the functional layer and may be formed by repeating a coating process 1 to 20 times.

The protective layer may have a thickness of 2 nm to 100 nm.

A metal for the metallic material layer may be the Ni alloy, and the Ni alloy may be one from the group consisting of NiCu alloy, NiCr alloy, and NiV alloy; and in mass percentage, the NiCu alloy may be composed of 60% to 80% of Ni and 20% to 40% of Cu, the NiCr alloy may be composed of 70% to 90% of Ni and 10% to 30% of Cr, and the NiV alloy may be composed of 80% to 95% of Ni and 5% to 20% of V.

A metal for the metallic material layer may be the Cr alloy, and the Cr alloy may be one from the group consisting of CrCu alloy, CrV alloy, and CrCo alloy; and in mass percentage, the CrCu alloy may be composed of 60% to 90% of Cr and 10% to 40% of Cu, the CrV alloy may be composed of 40% to 80% of Cr and 20% to 60% of V, and the CrCo alloy may be composed of 60% to 90% of Cr and 10% to 40% of Co.

The non-metallic material layer will form an organic protective layer on a surface of the functional layer, which has strong chemical stability and excellent corrosion resistance. The alloy metallic layer forms a mixed passivation film on a surface of the functional layer, which can play an anti-corrosion role at a high temperature.

The elemental metal forms a mixed passivation film on a surface of the functional layer, which can play an anti-corrosion role at a high temperature.

|  | Non-metallic material layer | Alloy metallic layer | Elemental metal |
| --- | --- | --- | --- |
| Component | Glucose complex | Chromium alloy | Chromium |
| Manufacturing mode | Soaking | Electroplating | Electroplating |
| Washing | No water washing + drying | Water washing + drying | No water washing + drying |
| Antioxidant performance | 100° C., 15 min | 180° C. to 200° C. 15 min | 150° C. 15 min |
| Validity period | 3 months | more than one year | more than one year |
| Cost | 78% | 85% | 88% |

Example 6

One of the implementations of the film of the present disclosure is provided. The main technical solution of this example is basically the same as that of Examples 1, 2, and 3. The features that are not explained in this example can be comprehended according to the explanations in Examples 1, 2, and 3, which will not be repeated here. This example is different from Examples 1, 2, and 3 in that:

A manufacturing process of a film is provided, including the following steps:

step 1. a bonding layer is formed on a base layer;

step 2. a functional layer is formed at an outer side of the bonding layer, where the functional layer is composed of a first composite copper layer and a second composite copper layer;

the first composite copper layer is formed by repeating copper coating on the bonding layer 1 to 500 times; and the second composite copper layer is formed by repeating copper coating on the first composite copper layer 2 to 500 times; and step 3. a metallic material protective layer or a non-metallic material protective layer is formed at an outer side of the functional layer.

The use of the above process can effectively reduce material costs, and an obtained film has physical and chemical properties superior to a film obtained by a traditional technology.

In step 1, the bonding layer is formed on each of front and back sides of the base layer by one from the group consisting of a resistive evaporation process, a high-frequency crucible evaporation process, an electron beam evaporation process, direct CVD reaction to produce oxides, CVD ion-assisted oxidation, CVD reaction to produce other compounds, a magnetron sputtering process, magnetron oxidation reaction, and an ALD process.

The bonding layer has technical parameters that are basically the same as a bonding layer of nickel but shows physical and chemical properties superior to a bonding layer obtained by a traditional technology, which can effectively reduce material costs.

In the step 2, a copper layer is formed on a surface of the bonding layer on the base layer obtained in step S1 by one from the group consisting of a PVD process, a galvanic plating process, and a CVD process. According to actual needs, 5 nm to 2,500 nm can be deposited each time and it may be repeated 2 to 500 times to obtain a functional layer with a required total thickness.

In the step 3, a protective layer is formed on a surface of the functional layer on the base layer obtained in step 2 by one from the group consisting of a PVD process, a galvanic plating process, a surface coating process, and a chemical reaction process.

When the bonding layer is a metallic material layer, the metallic material layer may be formed by a magnetron sputtering process; and when the bonding layer is a non-metallic material layer, the non-metallic material layer may be formed by one from the group consisting of direct CVD reaction to produce oxides, CVD ion-assisted oxidation, CVD reaction to produce other compounds, magnetron oxidation reaction, and ALD. The combination of the above processes can achieve the highest manufacturing efficiency.

When the composite copper layer includes a first composite copper layer and a second composite copper layer, the first composite copper layer may be formed by one from the group consisting of a PVD process and a CVD process, and the second composite copper layer may be formed by one from the group consisting of a galvanic plating process and a chemical plating process. The combination of the above processes can achieve a high manufacturing efficiency.

When a surface layer of the functional layer is the first composite copper layer, the protective layer is a metallic material layer; and when a surface layer of the functional layer is the second composite copper layer, the protective layer is a non-metallic material layer. The combination of the above processes can achieve a high manufacturing efficiency.

When the protective layer is a metallic material layer, the metallic material layer is formed by a PVD process; and when the protective layer is a non-metallic material layer, the non-metallic material layer is formed by one from the group consisting of a galvanic plating process and a surface coating process. The combination of the above processes can achieve the highest manufacturing efficiency and a low process cost.

A process flow of the bonding layer is as follows:

S1-1. A base layer undergoing corona or plasma treatment or an untreated base layer roll material was placed in a vacuum chamber of a single-sided or double-sided reciprocating vacuum coating machine, and the vacuum chamber was sealed; vacuum-pumping was conducted step by step until a vacuum degree reached $10^{-4}$ to $10^{-1}$ Pa; a crucible high-frequency heating method, a resistive heating method, or an electron beam heating method was adopted to provide an evaporation source, and a metal such as chromium, nickel alloy, or chromium alloy, or a non-metal such as SiC, $Si_3N_4$, $SiO_2$, or $Al_2O_3$ was used an evaporation raw material at the evaporation source, with a purity of ≥99.9%; a roll-in speed and a roll-out speed were adjusted as required; and a bonding layer was formed on the moving base layer from evaporated atoms or molecules (PVD).

S1-2. A base layer undergoing corona or plasma treatment or an untreated base layer roll material was placed in a vacuum chamber of a single-sided or double-sided reciprocating vacuum coating machine, and the vacuum chamber was sealed; vacuum-pumping was conducted step by step until a vacuum degree reached $10^{-4}$ to $10^{-1}$ Pa; a crucible high-frequency heating method, a resistive heating method, or an electron beam heating method was adopted to provide an evaporation source; compressed oxygen was introduced through an oxygen introduction structure of an oxygen delivery mechanism that was near an evaporation source, between an evaporation source and a film surface clinging to a drum, or near a main drum, and a volume flow rate was adjusted as required; aluminum wire, aluminum ingot, or silicon was used as an evaporation raw material at the evaporation source, with a purity of ≥99.9%; a roll-in speed and a roll-out speed were adjusted as required; and evaporated atoms reacted with oxygen to form a $SiO_x$ (1.5≤x≤2) or $AlO_x$ (1≤x≤1.5) layer on the moving base layer, which was the bonding layer (direct CVD reaction to produce oxides).

S1-3. A base layer undergoing corona or plasma treatment or an untreated base layer roll material was placed in a vacuum chamber of a single-sided or double-sided reciprocating vacuum coating machine, and the vacuum chamber was sealed; vacuum-pumping was conducted step by step until a vacuum degree reached $10^{-4}$ to $10^{-1}$ Pa; a crucible high-frequency heating method, a resistive heating method, or an electron beam heating method was adopted to provide an evaporation source; compressed oxygen was introduced through an oxygen introduction structure of an oxygen delivery mechanism that was near an evaporation source, between an evaporation source and a film surface clinging to a drum, or near a main drum, and a set of ion-assisted deposition devices was disposed near an evaporation source, between an evaporation source and a film surface clinging to a drum, or near a main drum to ionize oxygen; a current, a voltage, and a volume flow rate were adjusted as required; aluminum wire, aluminum ingot, or silicon was used as an evaporation raw material at the evaporation source, with a purity of ≥99.9%; a roll-in speed and a roll-out speed were adjusted as required; and evaporated atoms reacted with oxygen to form a $SiO_x$ (1.5≤x≤2) or $AlO_x$ (1≤x≤1.5) layer on the moving base layer, which was the bonding layer (CVD ion-assisted oxidation).

S1-4. A base layer undergoing corona or plasma treatment or an untreated base layer roll material was placed in a single-sided or double-sided reciprocating CVD device. (1) Silicon monoxide, trimethylaluminum (TMA), or aluminum chloride was used as a raw material, and oxygen, ozone, water, or carbon dioxide was used as a reaction gas source; a reaction ratio, a roll-out speed, and a roll-in speed were adjusted as required; and the CVD method was used to deposit a $SiO_x$ (1.5≤x≤2) or $AlO_x$ (1≤x≤1.5) layer on the base film. (2) Silicon chloride and methane were used as raw materials, and argon or hydrogen was used as a reaction gas source; a reaction ratio, a roll-out speed, and a roll-in speed were adjusted as required; and the CVD method was used to deposit a SiC layer on the base layer. (3) Silicon chloride was used as a raw material, nitrogen and hydrogen were used as reaction gas sources; a reaction ratio, a roll-out speed, and a roll-in speed were adjusted as required; and the CVD method was used to deposit a $Si_3N_4$ layer on the base film. (4) Silicon hydride and ammonia were used as raw materials, and argon and hydrogen were used as reaction gas sources; a reaction ratio, a roll-out speed, and a roll-in speed were adjusted as required; and the CVD method was used to deposit a $Si_3N_4$ layer on the base film, namely, the bonding layer (CVD reaction to produce other compounds).

S1-5. A base layer undergoing corona or plasma treatment or an untreated base layer roll material was placed in a vacuum chamber of a single-sided or double-sided reciprocating vacuum coating machine, and the vacuum chamber was sealed; vacuum-pumping was conducted step by step until a vacuum degree reached $10^{-5}$ to $10^{-1}$ Pa; and the magnetron sputtering was used to form a coating on a surface of the base layer. A target may be a metallic material such as nickel, chromium, nickel alloy, or chromium alloy; or a non-metallic material such as PTFE, PP, PE, SiC, $Si_3N_4$, $SiO_x$ ($1.5 \leq x \leq 2$), $AlO_x$ ($1 \leq x \leq 1.5$), or tripolycyanamide. An inert gas such as nitrogen, argon, or helium was used as a sputtering gas. A roll-in speed and a roll-out speed were adjusted as required. A magnetron sputtering coating was formed on the moving base layer from sputtered ions, which was the bonding layer. A metallic target had a purity of $\geq 99.9\%$, and a non-metallic target had a purity of $\geq 99.8\%$ (magnetron sputtering).

S1-6. A base layer undergoing corona or plasma treatment or an untreated base layer roll material was placed in a vacuum chamber of a single-sided or double-sided reciprocating vacuum coating machine, and the vacuum chamber was sealed; vacuum-pumping was conducted step by step until a vacuum degree reached $10^{-5}$ to $10^{-1}$ Pa; and the magnetron sputtering was used to form a coating on a surface of the base layer. A target was aluminum or silicon, with a purity of $\geq 99.9\%$. Oxygen, ozone, or ionized oxygen was used as a sputtering gas. The target was oxidized during a target sputtering process. A roll-in speed and a roll-out speed were adjusted as required. Sputtered target ions reacted with the gas molecules or ions introduced to form a magnetron sputtering coating $SiO_x$ ($1.5 \leq x \leq 2$) or $AlO_x$ ($1 \leq x \leq 1.5$) on the moving base layer, which was the bonding layer (magnetron oxidation reaction).

S1-7. A base layer undergoing corona or plasma treatment or an untreated base layer roll material was placed in a single-sided or double-sided reciprocating ALD device, and silicon monoxide or TMA (raw material) and oxygen (an oxygen source) or water were added into the device; and the raw material and the oxygen source successively entered into a reaction chamber and finally reacted on the base film to form a $SiO_x$ ($1.5 \leq x \leq 2$) or $AlO_x$ ($1 \leq x \leq 1.5$) layer, which was the bonding layer (ALD).

S2-1. A film roll material coated with the bonding layer obtained in S1 or with partial functional layer obtained by another method in S2 was placed in a vacuum chamber of a single-sided or double-sided reciprocating vacuum coating machine with a plasma device, and the vacuum chamber was sealed; vacuum-pumping was conducted step by step until a vacuum degree reached $10^{-4}$ to $10^{-1}$ Pa; before the film entered the evaporation zone, an inert gas such as nitrogen, argon, or helium was ionized through the plasma device to clean a film surface, and then the film entered the evaporation zone; a crucible high-frequency heating method, a resistive heating method, or accelerated electrons from an electron gun were used to provide an evaporation source, and copper with a purity of $\geq 99.9\%$ was heated by evaporation; a roll-in speed, a roll-out speed, and an evaporation discharge were adjusted as required; copper was continuously melted and evaporated in the evaporation source to form a copper layer on a surface of the film coated with the bonding layer or partial functional layer; and according to actual needs, 5 nm to 2,500 nm could be deposited each time and it was repeated 2 to 500 times to obtain the functional layer with a required total thickness (PVD).

S2-2. A film roll material coated with the bonding layer obtained in S1 or with partial functional layer obtained by another method in S2 was placed in a vacuum chamber of a single-sided or double-sided reciprocating vacuum magnetron sputtering coating machine with a plasma device, and the vacuum chamber was sealed; vacuum-pumping was conducted step by step until a vacuum degree reached $10^{-5}$ to $10^{-1}$ Pa; before the film entered the coating zone, an inert gas such as nitrogen, argon, or helium was ionized through the plasma device to clean a film surface, and then the film entered the coating zone; the magnetron sputtering method was used to excite copper with a purity of $\geq 99.9\%$; a roll-in speed, a roll-out speed, and an evaporation discharge were adjusted as required; a copper layer was formed on a surface of the film coated with the bonding layer or partial functional layer; and according to actual needs, 2 nm to 2,500 nm could be deposited each time and it was repeated 2 to 500 times to obtain the functional layer with a required total thickness (magnetron sputtering).

S2-3. A conductive film roll material coated with a metal or metal alloy bonding layer obtained in Si or coated with partial functional layer in S2 was placed in a roll-to-roll galvanic plating device, where the conductive film had a sheet resistance of 10,000-5.5 mΩ; a roll-in speed, a roll-out speed, a current, a copper ion concentration, a brightening agent concentration, an adjuvant concentration, a PH value, and an electrolyte temperature were adjusted as required; and according to actual needs, 2 nm to 2,500 nm was deposited each time and it was repeated 2 to 500 times to obtain a functional layer with a required total thickness (galvanic plating).

S2-4. A film roll material coated with the bonding layer in S1 or with partial functional layer obtained by another method in S2 was placed in a CVD device. Cuprous chloride, copper chloride, butyl copper, or copper iodide was used as a raw material, and hydrogen or argon was used as a reaction gas source; a reaction ratio, a roll-in speed, and a roll-out speed were adjusted as required; and the CVD method was used to deposit a copper layer on the film, which was the functional layer (CVD).

S2-5. A film roll material coated with a metal or metal alloy bonding layer in Si or coated with partial functional layer in S2 was placed in a roll-to-roll chemical coating device; a sodium salt was used as the main salt, and copper sulfate was used as the main raw material; potassium sodium tartrate, an EDTA disodium salt, and the like were used as a complexing agent, and sodium hydroxide was used to adjust pH to 11.5 to 13; formaldehyde was used as a reducing agent, and potassium ferrocyanide, α,α'-bipyridine, methyldichlorosilane, and the like were used as a stabilizing agent; a roll-in speed and a roll-out speed were adjusted as required; and according to actual needs, 2 nm to 2,500 nm was deposited each time and it was repeated 2 to 500 times to obtain a functional layer with a required total thickness (chemical plating).

S3-1. A roll material with the functional layer obtained in S2 was placed in a vacuum chamber of a single-sided or double-sided reciprocating vacuum coating machine, and the vacuum chamber was sealed; vacuum-pumping was conducted step by step until a vacuum degree reached $10^{-4}$ to $10^{-1}$ Pa; a crucible high-frequency heating method, a resistive heating method, or an electron beam heating method was adopted to provide an evaporation source, and a metal such as nickel, chromium, nickel alloy, or chromium alloy was used an evaporation raw material at the evaporation source, with a purity of ≥99.9%; a roll-in speed and a roll-out speed were adjusted as required; and a protective layer was formed on a surface of the functional layer from evaporated atoms or molecules (PVD).

S3-2. A roll material with the functional layer obtained in S2 was placed in a vacuum chamber of a single-sided or double-sided reciprocating vacuum coating machine, and the vacuum chamber was sealed; vacuum-pumping was conducted step by step until a vacuum degree reached $10^{-5}$ to $10^{-1}$ Pa; and the magnetron sputtering was used to coat a surface of the functional layer on the film. A target was nickel, chromium, nickel alloy, or chromium alloy, with a purity of ≥99.9%. A roll-in speed and a roll-out speed were adjusted as required. A magnetron sputtering coating was formed on a surface of the functional layer from evaporated ions, which was the protective layer (magnetron sputtering).

S3-3. A roll material with the functional layer obtained in S2 was placed in a roll-to-roll galvanic plating device or machine, where the roll-to-roll galvanic plating machine could be included in the galvanic plating device in S2 or could be an independent set of devices; a film rolling mode was used to immerse materials in a solution of a solution tank, where potassium dichromate, glucose, or other anti-oxidant organics were dissolved in the solution of the solution tank at an appropriate concentration; and a roll-in speed, a roll-out speed, a current, a concentration, a PH, and a temperature were adjusted as required to form a coating on a surface of the functional layer, which was the protective layer (galvanic plating).

S3-4. A roll material with the functional layer obtained in S2 was placed in a single-sided or double-sided roll-to-roll surface coating device or machine, where the roll-to-roll surface coating machine could be included in the device in S2 or could be an independent set of devices; a film rolling mode was used to let materials pass through the surface coating machine, where the surface coating machine could uniformly coat potassium dichromate, glucose, or other anti-oxidant organics on a surface of the functional layer at an appropriate concentration; and a roll-in speed and a roll-out speed were adjusted as required to form a coating on a surface of the functional layer, which was the protective layer (surface coating).

A manufacturing process of a film was provided, including the following steps:

S1. A base layer undergoing corona or plasma treatment or an untreated base layer roll material was placed in a vacuum chamber of a double-sided vacuum coating machine, and the vacuum chamber was sealed; vacuum-pumping was conducted step by step until a vacuum degree reached $5\times10^{-3}$ Pa; and the magnetron sputtering was used to coat a surface of the base layer. A target was a nickel-copper alloy with a nickel content of 20% and a copper content of 80% and had a purity (a total content of nickel+copper) of ≥99.995%. A roll-out speed and a roll-in speed were set to 100 m/min, a target power was set to 30 Kw, an argon flow volume was set to 2,000 SCCM, and a working vacuum when the argon was introduced was set to $6\times10^{-3}$ Pa to $8\times10^{-3}$ Pa. A magnetron sputtering coating with a thickness of about 3 nm was formed on the moving base layer from sputtered ions. After one pass was completed, the chamber was opened for cleaning the device; and then the above process was repeated 10 times. A 3 nm magnetron sputtering coating was obtained each time, and a nickel coating with a total thickness of 30 nm was formed on each side of the film after repeating 10 times, which was the bonding layer. The bonding layer had a sheet resistance of 1Ω to 6Ω.

S2. A film roll material coated with a metal alloy bonding layer obtained in Si was placed in a roll-to-roll galvanic plating device; a roll-in speed and a roll-out speed were adjusted to 10 m/min, a current was adjusted to 500,000 A, a copper ion concentration, a brightening agent concentration, and an adjuvant concentration were adjusted appropriately, a pH was adjusted to 7 to 13, and an electrolyte temperature was adjusted to 15° C. to 25° C.; and a functional layer with a thickness of 1,500 nm was formed on each side of the film at one time.

S3. A roll material with the functional layer obtained in S2 was placed in a single-sided roll-to-roll surface coating device or machine; a film rolling mode was used to let materials pass through the surface coating machine, where the surface coating machine could uniformly coat a potassium dichromate solution on a surface of the functional layer at an appropriate concentration; and a roll-in speed and a roll-out speed were adjusted to 80 m/min to form a protective layer with a corresponding thickness of 5 nm to 8 nm on a surface of the functional layer.

A manufacturing process of a film was provided, including the following steps:

S1. A base layer undergoing corona or plasma treatment or an untreated base layer roll material was placed in a vacuum chamber of a single-sided vacuum coating machine, and the vacuum chamber was sealed; vacuum-pumping was conducted step by step until a vacuum degree reached $8\times10^{-3}$ to $1\times10^{-2}$ Pa; the crucible heating method was used to provide an evaporation source, and compressed oxygen was introduced through an oxygen introduction structure near the evaporation source at an oxygen flow volume of 12,000 SCCM; aluminum wire with a purity of ≥99.99% was used as an evaporation raw material at the evaporation source, and a roll-in speed and a roll-out speed were adjusted to 1,200 m/min; and vaporized atoms reacted with oxygen to form a $AlO_x$ (x=1 to 1.5) layer with a thickness of 2 nm to 30 nm on the moving base layer, which was the bonding layer.

S2. A film roll material coated with the bonding layer obtained in S1 was placed in a vacuum chamber of a double-sided reciprocating vacuum coating machine with a plasma device, and the vacuum chamber was sealed; vacuum-pumping was conducted step by step until a vacuum degree reached $8\times10^{-3}$ Pa to $1\times10^{-2}$ Pa; before the film entered the evaporation zone, an inert gas such as dry air was ionized through the plasma device (with dry air flow volume of 3,000 SCCM and plasma power of 50 Kw) to clean a film surface, and then the film entered the evaporation zone; a graphite crucible medium-frequency heating method was used to provide an evaporation source, and a copper ingot with a purity of ≥99.99% was heated by crucible heating evaporation; a roll-in speed and a roll-out speed were set to 800 m/min, a general cold temperature was set to about 50° C., and a medium-frequency supply current was set to 30 A; copper was continuously melted and evaporated in the evaporation source to form a copper layer on each side of the film coated with the bonding layer; and 10 nm could be deposited each time and it was repeated 10 times in a reciprocating manner to obtain the functional layer B1 with a total thickness of 90 nm to 100 nm, at which time, the film had a sheet resistance of 200 mΩ to 300 mΩ.

S2. A film roll material coated with partial metal functional layer obtained in the above S2 was placed in a roll-to-roll galvanic plating device; a roll-in speed and a roll-out speed were adjusted to 20 m/min, a current was adjusted to 3,000 A, a copper ion concentration, a brightening agent concentration, and an adjuvant concentration were adjusted appropriately, a pH was adjusted to 7 to 13, and an electrolyte temperature was adjusted to 15° C. to 25° C.; and a functional layer B2 with a thickness of 1,500 nm was formed on each side of the film at one time, at which time, the functional layers B1 and B2 together constituted a functional layer with a thickness of 1,600 nm.

S3. A roll material with the functional layer obtained in S2 was placed in a single-sided roll-to-roll surface coating device or machine; a film rolling mode was used to let materials pass through the surface coating machine, where the surface coating machine could uniformly coat a potassium dichromate solution on a surface of the functional layer at an appropriate concentration; and a roll-in speed and a roll-out speed were adjusted to 80 m/min to form a protective layer with a corresponding thickness of 5 nm to 8 nm on a surface of the functional layer.

A manufacturing process of a film was provided, including the following steps:

S1. A base layer undergoing corona or plasma treatment or an untreated base layer roll material was placed in a vacuum chamber of a double-sided vacuum coating machine, and the vacuum chamber was sealed; vacuum-pumping was conducted step by step until a vacuum degree reached $5 \times 10^{-3}$ Pa; and the magnetron sputtering was used to coat a surface of the base layer. A target was aluminum oxide with a purity of ≥99.995%. A roll-out speed and a roll-in speed were set to 10 m/min, a target power was set to 80 Kw, an oxygen flow volume was set to 2,000 SCCM, and a working vacuum when the oxygen was introduced was set to $6 \times 10^{-3}$ Pa to $9 \times 10^{-3}$ Pa. A magnetron sputtering coating with a thickness of about 5 nm was formed on the moving base layer from sputtered oxygen ions. After one pass was completed, the chamber was opened for cleaning the device; and then the above process was repeated 5 times. A 5 nm magnetron sputtering coating was obtained each time, and an aluminum oxide coating with a total thickness of 25 nm was formed on each side of the film after repeating 5 times, which was the bonding layer A2.

S1. A roll material with the bonding layer A2 obtained in S1 was placed in a vacuum chamber of a double-sided vacuum coating machine, and the vacuum chamber was sealed; vacuum-pumping was conducted step by step until a vacuum degree reached $5 \times 10^{-3}$ Pa; and the magnetron sputtering was used to coat a surface of the film. A target was chromium with a purity of ≥99.99%. A roll-out speed and a roll-in speed were set to 30 m/min, a target power was set to 20 Kw, an argon flow volume was set to 600 SCCM, and a working vacuum when the argon was introduced was set to $6 \times 10^{-3}$ Pa to $9 \times 10^{-3}$ Pa. A magnetron sputtering coating with a thickness of about 5 nm to 9 nm was formed on the moving base layer from sputtered ions. After one pass was completed, the chamber was opened for cleaning the device; and then the above process was repeated 2 times. A magnetron sputtering coating with a thickness of 5 nm to 9 nm was obtained each time, and a chromium coating with a total thickness of 10 nm to 18 nm was formed on each side of the film after repeating 2 times, which was the bonding layer A1. The bonding layers A2 and A1 together constituted a bonding layer with a thickness of 35 nm to 43 nm.

S2. A roll material with the bonding layer at 35 nm to 43 nm obtained in S1 was placed in a vacuum chamber of a double-sided reciprocating vacuum coating machine, and the vacuum chamber was sealed; vacuum-pumping was conducted step by step until a vacuum degree reached $5 \times 10^{-3}$ Pa; and the magnetron sputtering was used to coat a surface of the film. A target was copper with a purity of ≥99.995%. A roll-out speed and a roll-in speed were set to 10 m/min, a target power was set to 10 Kw, an argon flow volume was set to 530 SCCM, and a working vacuum when the argon was introduced was set to $6 \times 10^{-3}$ Pa to $9 \times 10^{-3}$ Pa. A magnetron sputtering copper layer with a thickness of 60 nm was formed on the moving base layer from sputtered ions. After one pass was completed, there was no need to open the chamber for cleaning; and then the above process was repeated 20 times in a reciprocating manner. A magnetron sputtering coating with a thickness of 60 nm was obtained each time, and a copper layer with a total thickness of 1,200 nm was formed on each side of the film after repeating 20 times, namely, the functional layer B1, at which time, the film had a sheet resistance of 15 mΩ to 17 mΩ.

S4. A roll material with the functional layer obtained in S3 was placed in a single-sided roll-to-roll surface coating device or machine; a film rolling mode was used to let materials pass through the surface coating machine, where the surface coating machine could uniformly coat a potassium dichromate solution on a surface of the functional layer at an appropriate concentration; and a roll-in speed and a roll-out speed were adjusted to 80 m/min to form a protective layer with a corresponding thickness of 5 nm to 8 nm on a surface of the functional layer.

The above described are merely specific implementations of the present disclosure, and the protection scope of the present disclosure is not limited thereto. Any modification or replacement easily conceived by those skilled in the art within the technical scope of the present disclosure should fall within the protection scope of the present disclosure. Therefore, the protection scope of the present disclosure should be subject to the protection scope of the claims.

What is claimed is:

1. A film, comprising a base layer, wherein each of front and back sides of the base layer is provided with a bonding layer, a functional layer, and a protective layer in sequence;
   the functional layer comprises a first composite copper layer and a second composite copper layer;
   the first composite copper layer is formed by repeating copper coating by a physical vapor deposition (PVD) process on a surface of the bonding layer 1 to 500 times; and
   the second composite copper layer is formed by repeating copper coating by an electroplating process on a surface of the first composite copper layer 1 to 500 times, and wherein
   the surface of the functional layer has no pinholes or wrinkles.

2. The film according to claim 1, wherein the first composite copper layer is formed by repeating the physical vapor deposition (PVD) process 1 to 30 times, and the second composite copper layer is formed by repeating the electroplating process 1 to 10 times.

3. The film according to claim 1, wherein the functional layer is composed of the first composite copper layer and the second composite copper layer at an outer side of the first composite copper layer; the first composite copper layer is first deposited on the bonding layer, and then the second composite copper layer is plated on the first composite copper layer; and a thickness of the first composite copper layer is smaller than a thickness of the second composite copper layer.

4. The film according to claim 1, wherein the first composite copper layer and the second composite copper layer have a total thickness of 30 nm to 2,500 nm.

5. The film according to claim 1, wherein the bonding layer is a metallic material layer, and a metal for the metallic material layer is one selected from the group consisting of Ti, W, Cr, Ni, a Ni alloy, and a Cr alloy.

6. The film according to claim 5, wherein the bonding layer is a non-metallic material layer, and a material for the non-metallic material layer is one selected from the group consisting of PVDC, NiO, Si, PTFE, PP, PE, SiC, $Si_3N_4$, $SiO_x$ ($1.5 \leq x \leq 2$), $AlO_x$ ($1 \leq x \leq 1.5$), and tripolycyanamide.

7. The film according to claim 6, wherein when a non-metallic material for the non-metallic material layer is $SiO_x$ ($1.5 \leq x \leq 2$), the non-metallic material layer has a thickness of 10 nm to 40 nm.

8. The film according to claim 6, wherein when a non-metallic material for the non-metallic material layer is $AlO_x$ ($1 \leq x \leq 1.5$), the non-metallic material layer has a thickness of 3 nm to 40 nm.

9. The film according to claim 6, wherein the non-metallic material layer is provided in 1 to 10 layers.

10. The film according to claim 6, wherein the non-metallic material layer has a thickness of 3 nm to 40 nm.

11. The film according to claim 5, wherein the bonding layer is a composite material layer composed of the metallic material layer and a non-metallic material layer; the metal for the metallic material layer is one selected from the group consisting of Ti, W, Cr, Ni, the Ni alloy, and the Cr alloy; and a material for the non-metallic material layer is one selected from the group consisting of PVDC, NiO, Si, PTFE, PP, PE, SiC, $Si_3N_4$, $SiO_x$ ($1.5 \leq x \leq 2$), $AlO_x$ ($1 \leq x \leq 1.5$), and tripolycyanamide.

12. The film according to claim 5, wherein the metallic material layer is composed of 1 to 10 metallic material layers.

13. The film according to claim 5, wherein the metal for the metallic material layer is the Ni alloy, and the Ni alloy is one selected from the group consisting of NiCu alloy, NiCr alloy, and NiV alloy; and in mass percentage, the NiCu alloy is composed of 60% to 80% of Ni and 20% to 40% of Cu, the NiCr alloy is composed of 70% to 90% of Ni and 10% to 30% of Cr, and the NiV alloy is composed of 80% to 95% of Ni and 5% to 20% of V.

14. The film according to claim 5, wherein the metal for the metallic material layer is the Cr alloy, and the Cr alloy is one selected from the group consisting of CrCu alloy, CrV alloy, and CrCo alloy; and in mass percentage, the CrCu alloy is composed of 60% to 90% of Cr and 10% to 40% of Cu, the CrV alloy is composed of 40% to 80% of Cr and 20% to 60% of V, and the CrCo alloy is composed of 60% to 90% of Cr and 10% to 40% of Co.

15. The film according to claim 5, wherein the metallic material layer has a thickness of 3 nm to 40 nm.

16. The film according to claim 1, wherein the protective layer is a metallic material layer, and a metal for the metallic material layer is one selected from the group consisting of Cr, Ni, a Ni alloy, and a Cr alloy.

17. The film according to claim 1, wherein the protective layer is a non-metallic material layer, and a non-metallic material for the non-metallic material layer is one selected from the group consisting of glucose and potassium dichromate.

18. The film according to claim 17, wherein the protective layer is provided at an outer side of the functional layer and is formed by repeating a coating process 1 to 20 times.

19. The film according to claim 1, wherein the base layer is made of at least one material selected from the group consisting of OPP, PET, PI, PS, PPS, CPP, PEN, PVC, SPS, PEEK, PES, PPSU, PE, and a non-woven fabric.

20. The film according to claim 19, wherein the base layer has a thickness of 1.2 μm to 12 μm.

21. A manufacturing process of a film, comprising the following steps:

step 1. forming a bonding layer on a base layer;

step 2. forming a functional layer at an outer side of the bonding layer, wherein the functional layer is composed of a first composite copper layer and a second composite copper layer; the first composite copper layer is formed by repeating copper coating by a physical vapor deposition (PVD) process on the bonding layer 1 to 500 times; and the second composite copper layer is formed by repeating copper coating by an electroplating process on the first composite copper layer 1 to 500 times; and step 3. forming a metallic material protective layer or a non-metallic material protective layer at an outer side of the functional layer.

22. The manufacturing process of the film according to claim 21, wherein in the step 1, the bonding layer is formed on each of front and back sides of the base layer by one selected from the group consisting of a physical vapor deposition (PVD) process, a chemical vapor deposition (CVD) process, and an atomic layer deposition (ALD) process.

23. The manufacturing process of the film according to claim 22, wherein when the bonding layer is a metallic material layer, the metallic material layer is formed by a PVD process; and when the bonding layer is a non-metallic material layer, the non-metallic material layer is formed by one selected from the group consisting of a direct CVD reaction to produce oxides, a CVD ion-assisted oxidation, a CVD reaction to produce other compounds, and ALD.

24. The manufacturing process of the film according to claim 21, wherein in the step 3, a protective layer is formed on a surface of the functional layer on the bonding layer obtained in the step 2 by one selected from the group consisting of a PVD process, a CVD process, an electroplating process, and a surface coating process.

25. The manufacturing process of the film according to claim 24, wherein when the protective layer is a metallic material layer, the metallic material layer is formed by a PVD process; and when the protective layer is a non-metallic material layer, the non-metallic material layer is formed by one selected from the group consisting of an electroplating process and a surface coating process.

* * * * *